United States Patent [19]
Kornachuk et al.

[11] Patent Number: 5,751,649
[45] Date of Patent: May 12, 1998

[54] HIGH SPEED MEMORY OUTPUT CIRCUITRY AND METHODS FOR IMPLEMENTING SAME

[75] Inventors: Steve P. Kornachuk; Scott T. Becker, both of San Jose, Calif.

[73] Assignee: Artisan Components, Inc., Sunnyvale, Calif.

[21] Appl. No.: 806,335

[22] Filed: Feb. 26, 1997

[51] Int. Cl.$^6$ ...................................................... G11C 7/00
[52] U.S. Cl. ........................................ 365/205; 365/189.05
[58] Field of Search ................................ 365/189.05, 205, 365/233, 190

[56]  References Cited

U.S. PATENT DOCUMENTS

| | | | |
|---|---|---|---|
| 4,128,900 | 12/1978 | Lappington | 365/189.05 X |
| 5,146,427 | 9/1992 | Sasaki et al. | 365/189.05 |
| 5,214,609 | 5/1993 | Kato et al. | 365/189.05 |
| 5,311,471 | 5/1994 | Matsumoto et al. | 365/189.05 |
| 5,555,521 | 9/1996 | Hamada et al. | 365/185.03 |
| 5,561,629 | 10/1996 | Curd | 365/185.21 |
| 5,625,586 | 4/1997 | Yamasaki et al. | 365/104 |
| 5,636,161 | 6/1997 | Mann | 365/185.21 |

*Primary Examiner*—Joseph A. Popek
*Attorney, Agent, or Firm*—Hickman & Martine, LLP

[57] ABSTRACT

Disclosed is a latch sense amplifier output buffer for amplifying a data signal read from a memory. The latch sense amplifier output buffer includes a sense amplifier core having an amplifier circuit. The amplifier circuit provides amplification on the data signal read from a random access memory cell location. The sense amplifier core is preferably configured to generate an amplified data signal. Further included is an output data latching circuit that is configured to substantially simultaneously store the amplified data signal and generate an output data signal. An output buffer core includes an output driver circuit having a pull up transistor and a pull down transistor. The output driver circuit substantially concurrently receives the amplified data signal from the sense amplifier core and the output data signal from the output data latching circuit. The amplified data signal provides a fast turnoff to the pull up or pull down transistor, to thereby generate a rapid output at an output node coupled to the other pull up or pull down transistor.

28 Claims, 7 Drawing Sheets

HIGH SPEED MEMORY OUTPUT CIRCUITRY AND METHODS FOR IMPLEMENTING SAME

BACKGROUND OF THE INVENTION

1. Field of the Invention

The present invention relates generally to integrated circuits, and more particularly to methods and apparatuses for high speed amplifying and output buffer circuitry for memory output operations.

2. Description of the Related Art

As is well known in the art, random access memory (RAM) devices are generally array structures composed of $2^n$ by $2^m$ individual RAM cells which are coupled to wordlines (rows) and complementary bit lines (columns). A typical RAM memory cell may be composed of between 4 and 6 transistors coupled together to form a data storage device. An individual RAM memory cell may be selected when an X-decoder is used to select rows and a Y-decoder is used to select columns. Typically, data is written into an individual RAM cell when the proper address is selected and a WRITE ENABLE circuitry allows digital data in the form of a differential voltage signal to be input into a selected memory cell location. As is well known in the art, once a specific memory cell is addressed within a RAM device and a READ ENABLE circuitry is active, a very small voltage amplitude representing the addressed digital data is sensed. However, to produce a readable voltage amplitude representing useful digital data, a sense amplifier is typically implemented to amplify the sensed signal.

FIG. 1A shows a conventional RAM addressing block diagram used for outputting digital data stored within a RAM core 100. By way of example, when RAM core 100 includes 1,000 rows by 1,000 columns, RAM core 100 may be classified as a one megabit (1 MB) RAM storage device. In typical architectures, computers access RAM core 100 through an address input bus 110 that may be coupled to a conventional X-DECODER 102 and a conventional Y-DECODER 104. In general, X-DECODER 102 is used for addressing a selected row (wordlines) within RAM core 100, and Y DECODER 104 is used for addressing a selected column (bitlines) within RAM core 100. By way of example, X and Y decoders are generally implemented for reducing memory array aspect ratios by folding (i.e., dividing) long addressable memory columns into several shorter memory columns. Once folded into several columns, the X and Y decoders are capable of reading or writing the addressed data by appropriately performing a suitable multiplexing function.

Once a row and column is selected from RAM core 100, either a write or a read operation may be performed on the selected RAM memory cell. In order to perform a write operation, a write control circuit 107 is enabled which allows digital data to be input into a selected RAM memory cell via an input data bus 101. Generally, this digital data is in the form of a voltage waveform that represents either a logical "1" or a logical "0". Input buffer 109 amplifies a input signal 103 that is supplied by RAM input bus 111. In this manner, the selected transistors in RAM core 100 may be driven to an appropriate state.

In a like manner, once the row and column is selected in RAM core 100, a read operation may be performed which produces a voltage representing the addressed digital data on a data bus 112. At this point, the addressed digital data may be as low as about 50 milli-volts (mV). As described above, to appropriately read the addressed digital data, suitable amplification is typically performed in a latch sense amplifier 106. Once the sensed data signal is amplified to about 3.3 volts or about 5 volts in latch sense amplifier 106, the voltage amplified data is passed out as amplified data output 114 to an output buffer 108. At output buffer 108, the voltage amplified data 115 is current amplified to provide an appropriate level of current drive once the read data is passed to a RAM output bus 116.

FIG. 1B illustrates a conventional output buffer 108. As shown, output buffer 108 contains a rail voltage (Vdd) that is typically about 3.3 volts or about 5 volts connected to a "pull up" transistor 154, which in turn is connected to a "pull down" transistor 152. Connected to the gates of transistors 154 and 152 is a NAND gate 162 and a NOR gate 144, respectively. An external OE (output enable) signal is then generally provided as an input to NAND gate 162 and an inverted/OE signal is provided as an input to the NOR gate 144. In general, the external OE signal is phase inverted by an inverter 132 before being passed to the NOR gate 144. Also shown is an input signal 114 being passed through two stages of inverters 145 and 146 to provide the output buffer with sufficient drive. In turn, the output of the second inverter 146 is passed as an input to both the NAND gate 162 and the NOR gate 144.

When output buffer 108 is enabled, and signal 114 is high (i.e., logical "1"), output drive transistor 154 is turned on while at the same time output drive transistor 152 is turned off. When this happens, output signal 115 is shifted to a Vdd voltage level (i.e., logical "1"). Conversely, when signal 114 is low (i.e., logical "0"), output drive transistor 154 is turned off while at the same time output drive transistor 152 is turned on, therefore driving output signal 115 to a Vss voltage level (i.e., logical "0").

Typically, the above described output buffer configuration introduces delays that may be unsuitable for speed sensitive applications. By way of example, average propagation delays are typically measured based on rise and fall times of input signal 114 with respect to the rise and fall times of output signal 115. In this example, delays totaling up to about 6 gate delays may be introduced by output buffer 108.

Unfortunately, in applications where the read output time is of critical importance, the slow response of output buffer 108 and its associated amplification circuitry may disadvantageously limit a system's overall performance. For example, although current technology CPU (Central Processing Unit) system clock speeds have continually increased, memory output operations are a necessity when performing data reads from memory. As can be appreciated, the slowest operation in a CPU/memory output link will ultimately determine a system's overall processing performance. It is thus of paramount importance that delays associated with performing memory output operations be reduced to prevent more global system delays.

In view of the foregoing, there is a need for methods and apparatuses for providing high speed memory output circuitry. In particular, there is a need for amplification and output buffer circuitry that increases the speed of memory output operations while simultaneously decreasing power consumption.

SUMMARY OF THE INVENTION

Broadly speaking, the present invention relates to a high speed latch sense amplifier and an output buffer circuit architecture. The various embodiments of the present invention may be implemented in many forms, and find particular use in amplifying signals in memory output operations.

However, it should be appreciated that the present invention may be implemented in numerous ways, including as a process, an apparatus, a system, a device, or a method. Several inventive embodiments of the present invention are described below.

In one embodiment, a latch sense amplifier output buffer for amplifying a data signal read from a memory device is disclosed. The latch sense amplifier output buffer includes a sense amplifier core having an amplifier circuit. The amplifier circuit provides amplification on the data signal read from a random access memory cell location. The sense amplifier core is preferably configured to generate an amplified data signal. Further included is an output data latching circuit that is configured to substantially simultaneously store the amplified data signal and generate an output data signal. An output buffer core includes an output driver circuit having a pull up transistor and a pull down transistor. The output driver circuit substantially concurrently receives the amplified data signal from the sense amplifier core and the output data signal from the output data latching circuit. The amplified data signal provides a fast turnoff to one of the pull up and pull down transistors, thereby generating a rapid output from one of the pull up and pull down transistors.

In another embodiment, a method for amplifying a data signal read from a memory device includes the following operations. Initially, an amplified read signal is generated in a latch sense amplifier. Once the amplified read signal is generated, the amplified read signal is stored in a data storage latch and is concurrently passed to an output buffer circuit. The data storage latch being configured to generate an output data latch signal to an output buffer core. Then, enabling the output buffer core upon receiving the output data latch signal from the data storage latch. Once the output buffer core is enabled, the output data latch signal is propagated to each of a pull up transistor and a pull down transistor. Then, the amplified read signal is output from one of the pull up and the pull down transistors.

In yet another embodiment, a method for outputting an amplified data signal read from a memory device is disclosed. The method includes storing the amplified data signal in a data storage latch and simultaneously outputting the amplified data signal to an output buffer circuit. The data storage latch is preferably implemented to propagate an output data latch signal to an output buffer driver, enabling the output buffer driver when the output data latch signal from the data storage latch is received, and passing the output data latch signal to a pair of output driving transistors. Once the output data latch signal is received by the pair of output driving transistors, the amplified data signal is output from one of the pair of output driving transistors.

Advantageously, the various embodiments of the present invention provide fast amplification and outputting operations when reading data out from memory devices. In addition, the data being output is also substantially simultaneously stored in an output data latch. Furthermore, the fast turnoff features of the output circuitry provides substantial power savings over prior art designs. Other aspects and advantages of the invention will become apparent from the following detailed description, taken in conjunction with the accompanying drawings, illustrating by way of example the principles of the invention.

BRIEF DESCRIPTIONS OF THE DRAWINGS

The present invention will be readily understood by the following detailed description in conjunction with the accompanying drawings, wherein like reference numerals designate like structural elements, and in which.

Figure 3:
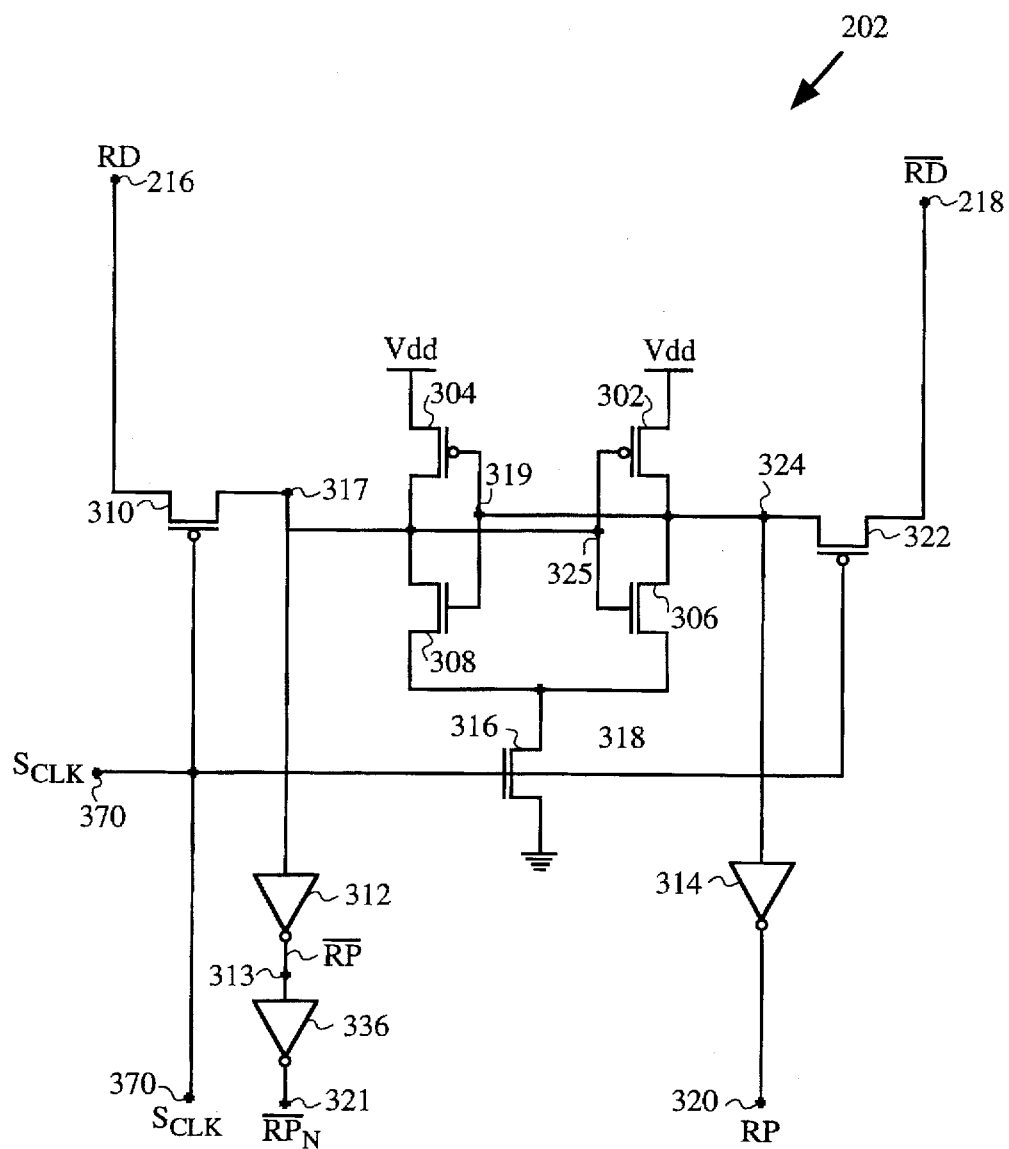

FIG. 3. is a circuit diagram illustrating preferred electrical interconnections contained within a latch sense amplifier circuit in accordance with one embodiment of the present invention.

Figure 4:
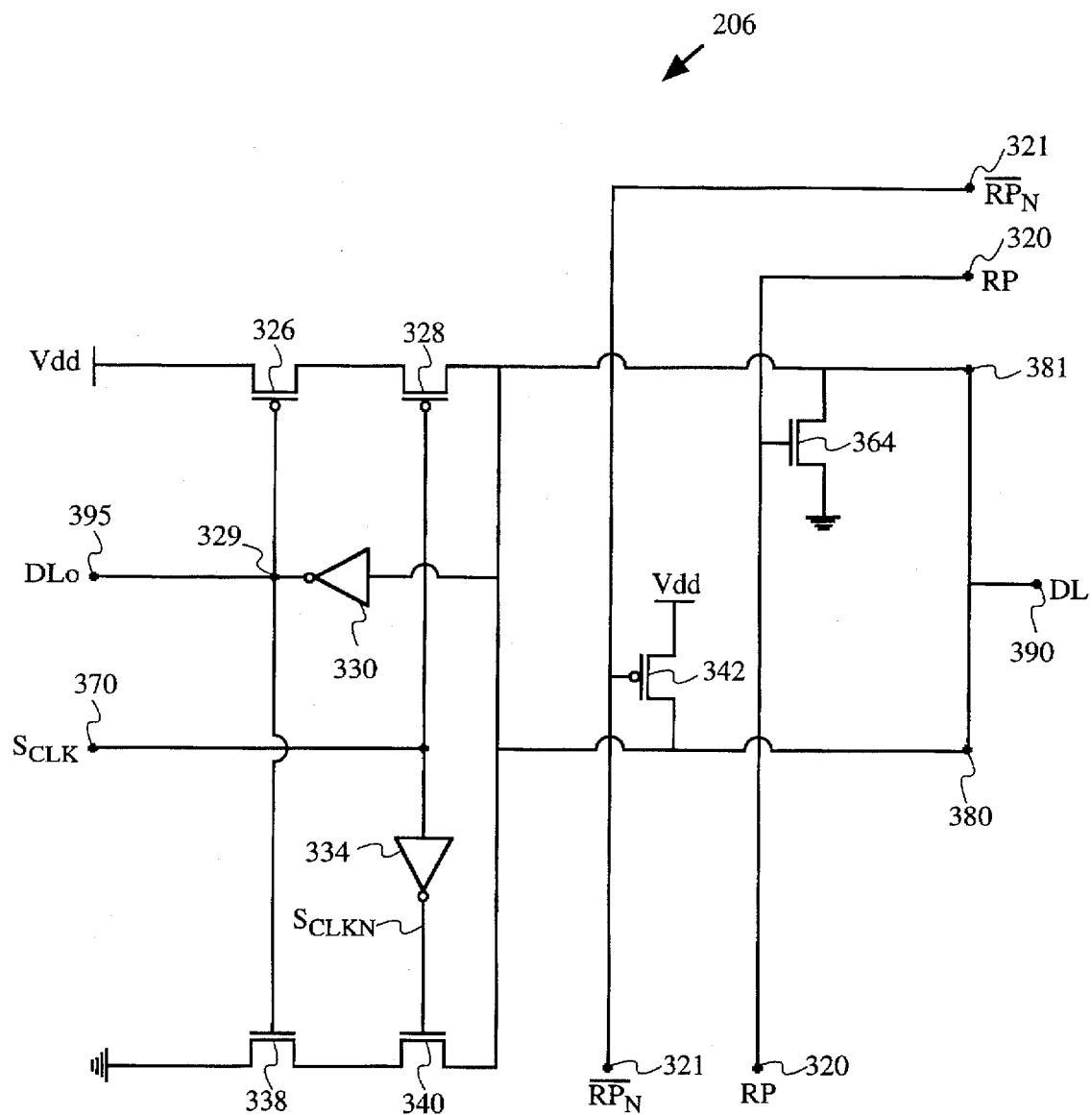

FIG. 4 is a circuit diagram illustrating preferred electrical interconnections contained within an output data latch circuit in accordance with one embodiment of the present invention.

Figure 5:
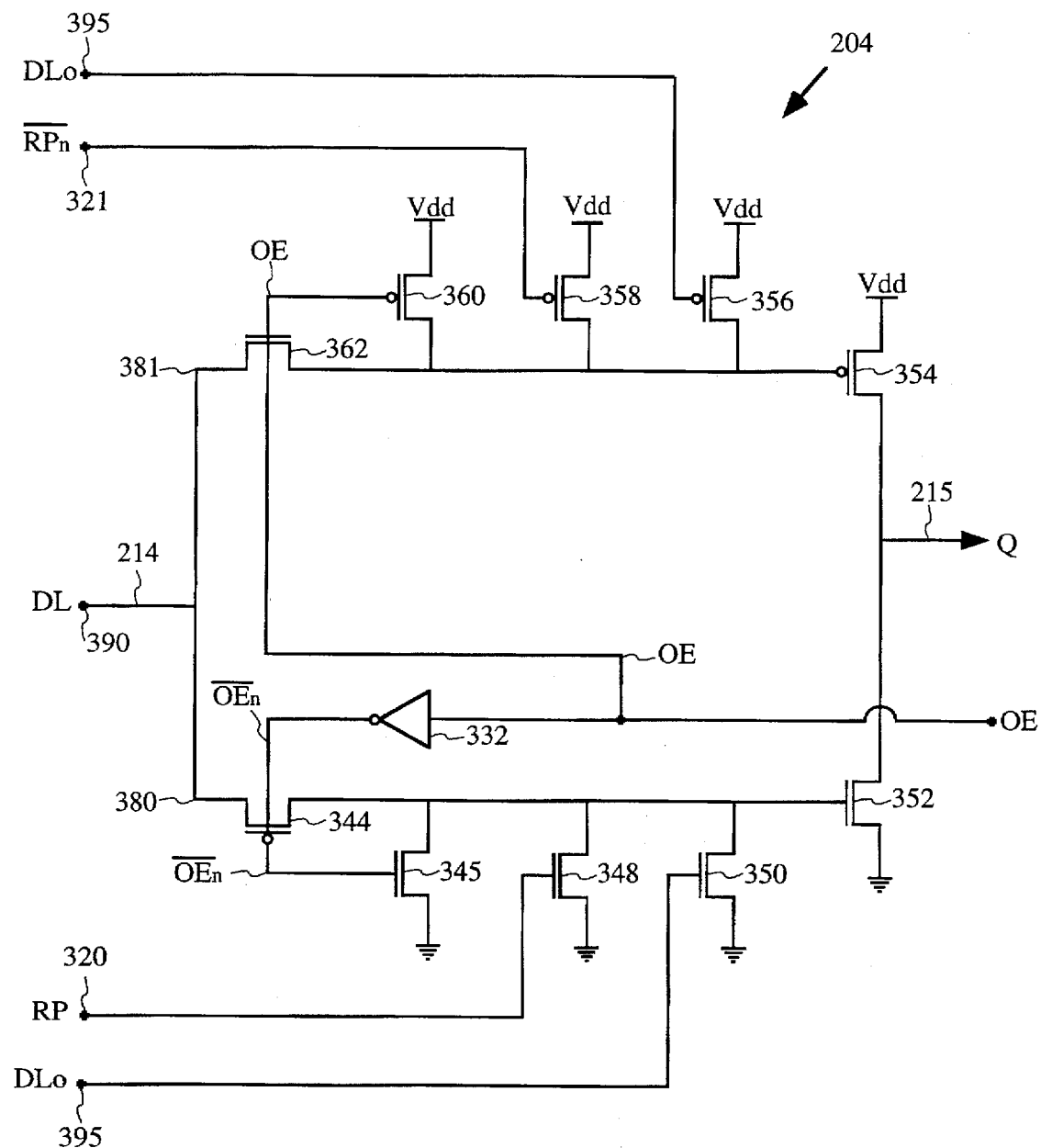

FIG. 5 is a circuit diagram illustrating preferred electrical interconnections contained within an output buffer circuit in accordance with one embodiment of the present invention.

DETAILED DESCRIPTION OF THE PREFERRED EMBODIMENTS

An invention for a high speed latch sense amplifier and output buffer circuit architecture is disclosed. The various embodiments of the present invention may be implemented in any form, and may find particular use in amplifying signals in memory output operations. In the following description, numerous specific details are set forth in order to provide a thorough understanding of the present invention. It will be obvious, however, to one skilled in the art, that the present invention may be practiced without some or all of these specific details. In other instances, well known process operations have not been described in detail in order not to unnecessarily obscure the present invention.

Figure 1A:
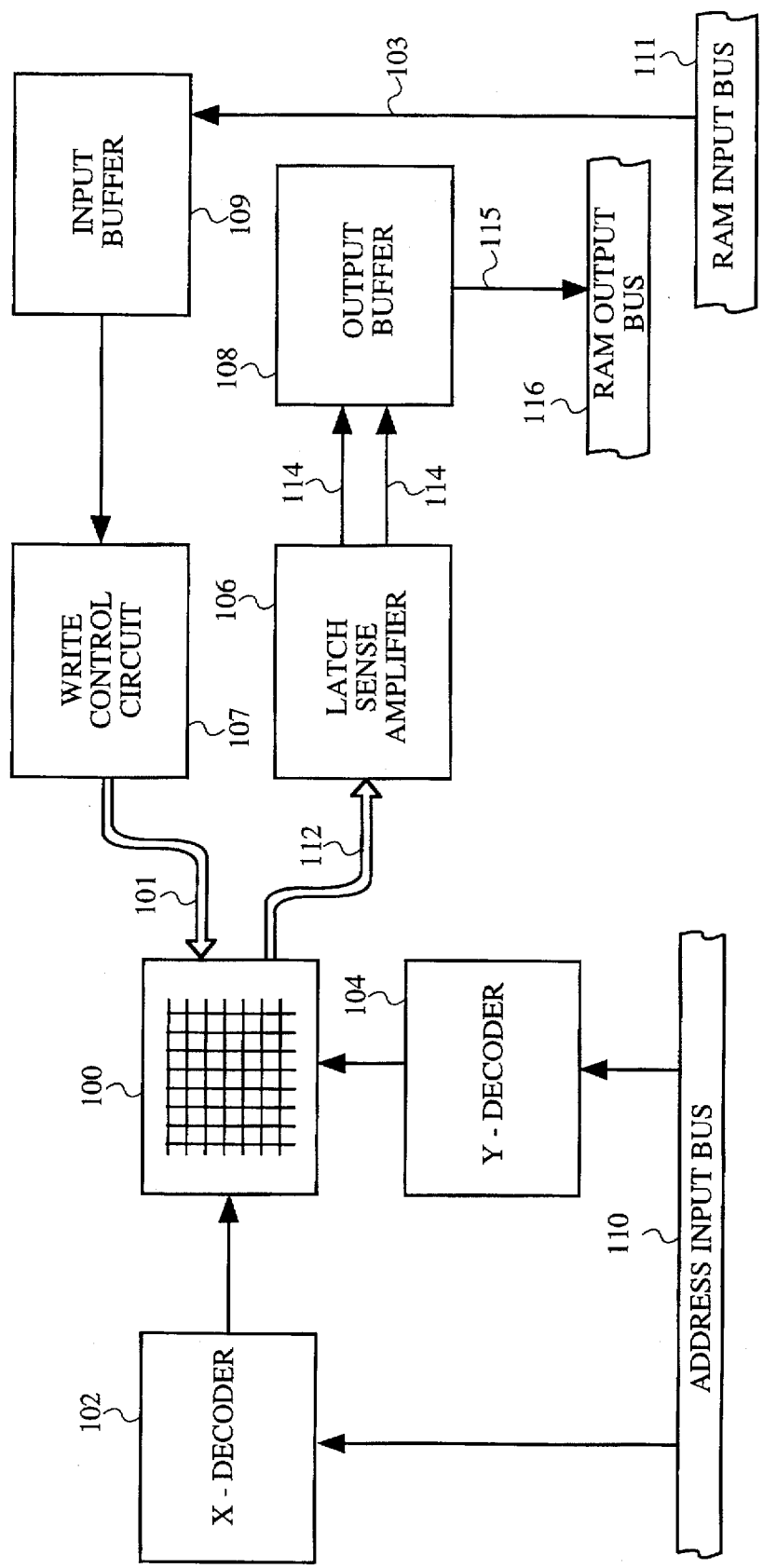
FIG. 1A shows a conventional RAM addressing block diagram used for outputting digital data stored within a RAM core.
Figure 1B:
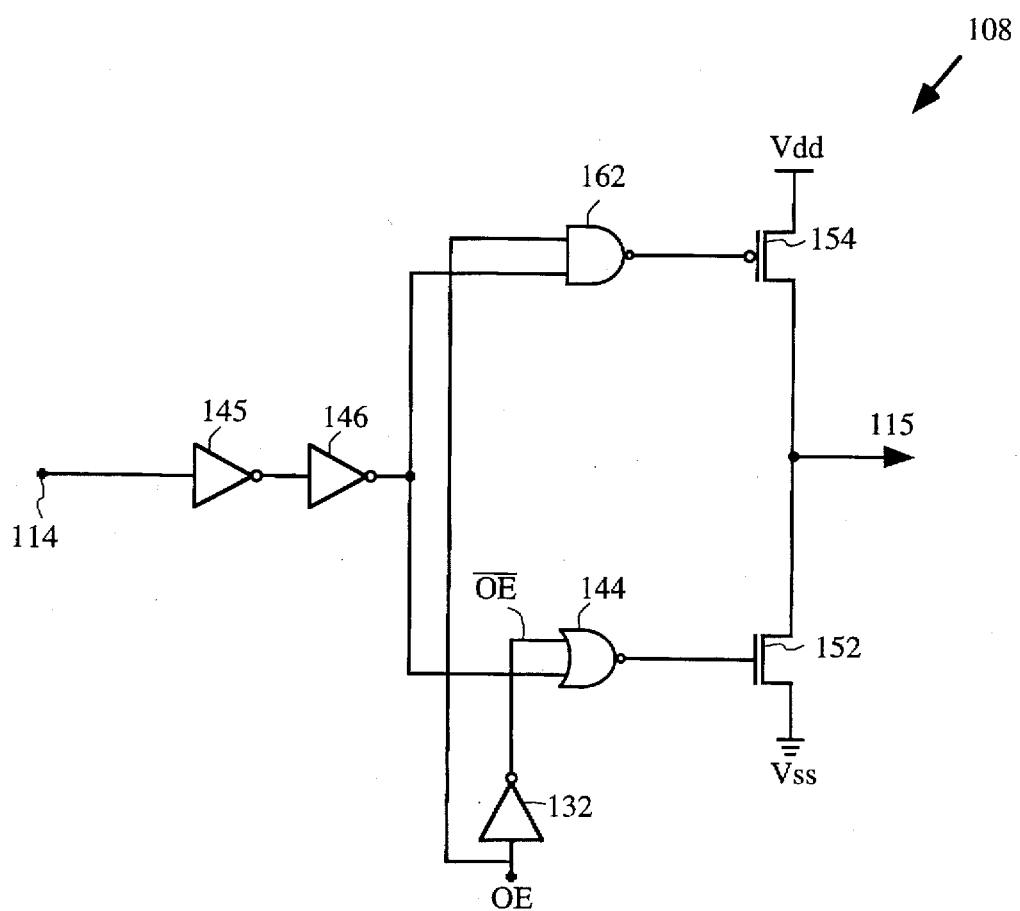
FIG. 1B illustrates conventional output buffer circuitry.
Figure 2A:
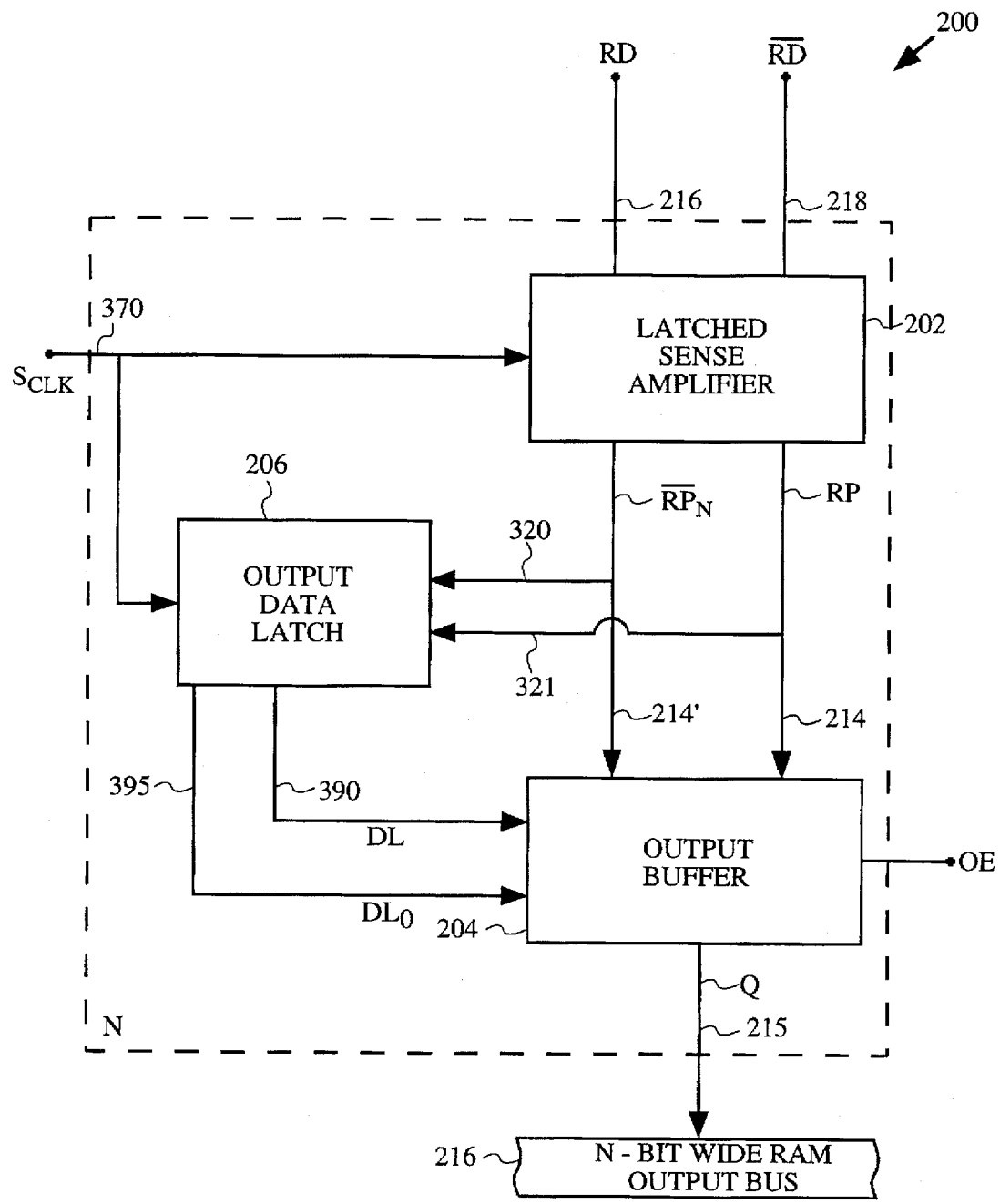
FIG. 2A shows an overview functional diagram of a latch sense amplifier output buffer architecture in accordance with one embodiment of the present invention.

FIG. 2A shows an overview functional diagram of a latch sense amplifier output buffer architecture 200 in accordance with one embodiment of the present invention. Architecture 200 generally includes a latch sense amplifier 202 that is preferably controlled by either a rising or falling edge of a sense clock signal $S_{CLK}$, an output data latching circuit 206 that is both disabled and enabled by either a rising or a falling edge of sense clock signal $S_{CLK}$, and an output buffer 204 that is generally both enabled and disabled by an output enable signal OE.

Broadly speaking, output data latch 206 is preferably implemented to store data that is read and amplified by latch sense amplifier 202 as well as providing the read data as an input to output buffer 204. In one embodiment sense clock signal $S_{CLK}$ preferably operates to substantially simultaneously enable latch sense amplifier 202 to voltage amplify data read from memory, and pass the amplified data (i.e., digital data) to output data latch 206 as well as output buffer 204. By way of example, the rising edge of sense clock signal $S_{CLK}$ preferably enables latch sense amplifier 202 and disables output data latch 206. Conversely, the falling edge of sense clock $S_{CLK}$ disables latch sense amplifier 202, and enables output data latch 206 to store data that is read out.

Although only one combination of latch sense amplifier 202, output data latch 206, and output buffer 204 is shown for ease of description, it should be understood that a single combination of latch sense amplifier 202, output data latch 206, and output buffer 204 is generally implemented for reading a single bitline pair from a suitable memory array (e.g., RAM). Accordingly, it should be appreciated that architecture 200 may be replicated any number of (N) times depending on the requirements of a particular memory output design. By way of example, if a 16-bit wide, 32-bit wide, or and N-bit wide output is desired, architecture 200 may be replicated 16 times, 32 times or N times, respectively.

As discussed in greater detail below, the sense clock signal $S_{CLK}$ provides a timing pulse suited to control the flow of data between latch sense amplifier 202 and output data latch 206. To ensure that output data latch 206 is capable of storing digital data being output from latch sense amplifier 202 during a read cycle, the rising edge of sense clock signal $S_{CLK}$ will preferably disable output data latch 206. Conversely, a falling edge of $S_{CLK}$ enables output data latch 206 such that data from latch sense amplifier 202 for a particular $S_{CLK}$ cycle is stored in output data latch 206.

In this embodiment, latch sense amplifier 202 is designed to amplify voltage signals 216 and 218 representing (RD) data and (/RD) data from a selected RAM cell location. Typically, a read data bus is used to electrically connect the output of a selected RAM cell location of the memory array to the inputs of latch sense amplifier 202. A rising edge of sense clock signal $S_{CLK}$ preferably enables (i.e., turns on) latch sense amplifier 202 which produces read signals RP and /RP$_N$ that drive lines 214 and 214' having a voltage level representative of digital data stored in a selected RAM cell location. As described above, the falling edge of sense clock signal $S_{CLK}$ preferably disables (i.e., turns off) latch sense amplifier 202 which essentially reconnects it to the read data bus. In this manner, output read signals RP and /RP$_N$ will preferably return to equilibrium.

Further, output data latch 206 is disabled by a rising edge of sense clock signal $S_{CLK}$ which advantageously allows the storage of data signals from latch sense amplifier 202. In this embodiment, because data signals from latch sense amplifier 202 are directly coupled as inputs to output data latch 206, data signals from latch sense amplifier 202 being passed to output buffer 204 are also substantially simultaneously stored in output data latch 206. On the other hand, a falling edge of sense clock $S_{CLK}$ preferably enables output data latch 206 assuring the integrity of stored data received from latch sense amplifier 202.

In this embodiment, when output buffer 204 is enabled, voltage and current amplification is performed to drive any external devices that may be electrically connected to an n-bitwide RAM output bus 216. On the other hand, when output buffer 204 is disabled, output node 215 will preferably transition to a well known high impedance state (i.e., tristate mode). Advantageously, data stored in output data latch 206 remains intact and capable of driving output node 215 whenever output buffer 204 is enabled. That is, the most currently read data is securely stored to allow future access to the read data when output buffer 204 is enabled.

Figure 2B:
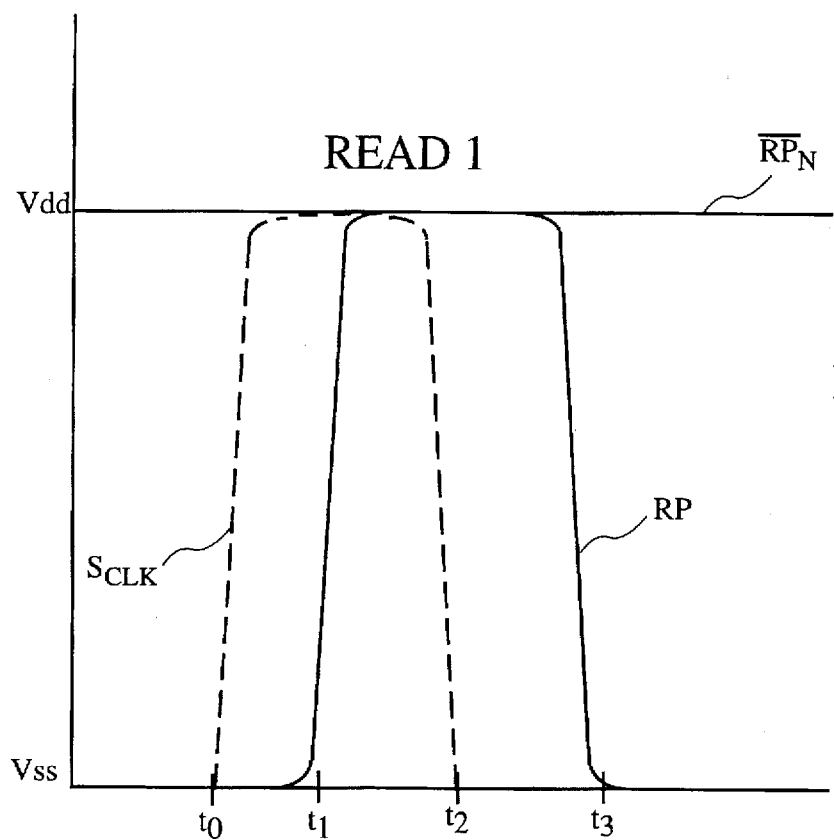
FIG. 2B is a graphical representation illustrating preferred output voltage signals /$RP_N$ and RP of a latch sense amplifier during a "read 1" cycle.

FIG. 2B is a graphical representation illustrating preferred output voltage signals /RP$_N$ and RP of latch sense amplifier 202 during a "read 1" cycle. In this embodiment, latch sense amplifier 202 voltage amplifies a sensed signal from a selected RAM cell location. For illustration purposes, assume that a logical "1" drives output signals /RP$_N$ and RP. Throughout the "read 1" cycle, signal /RP$_N$ remains at a constant (e.g., flat) voltage level of about Vdd which may be about 3.3 V or about 5.0 V. Preferably, latch sense amplifier 202 is enabled or disabled by a rising or a falling edge, respectively, of sense clock signal $S_{CLK}$ that has a width represented in this embodiment by an interval time $t_2$- time $t_0$.

In one embodiment, a "read 1" cycle is initiated by a rising edge of a sense clock $S_{CLK}$ signal (as indicated by time=time $t_0$) which causes the latch sense amplifier 202 to drive output signal RP to about Vdd beginning at some time $t_1$ subsequent to rising edge time $t_0$ of $S_{CLK}$. At the end of the current sense clock cycle (i.e. a falling edge) at time=time $t_2$, latch sense amplifier 202 is disabled and signal RP returns to its original value at about time=time $t_3$.

Figure 2C:
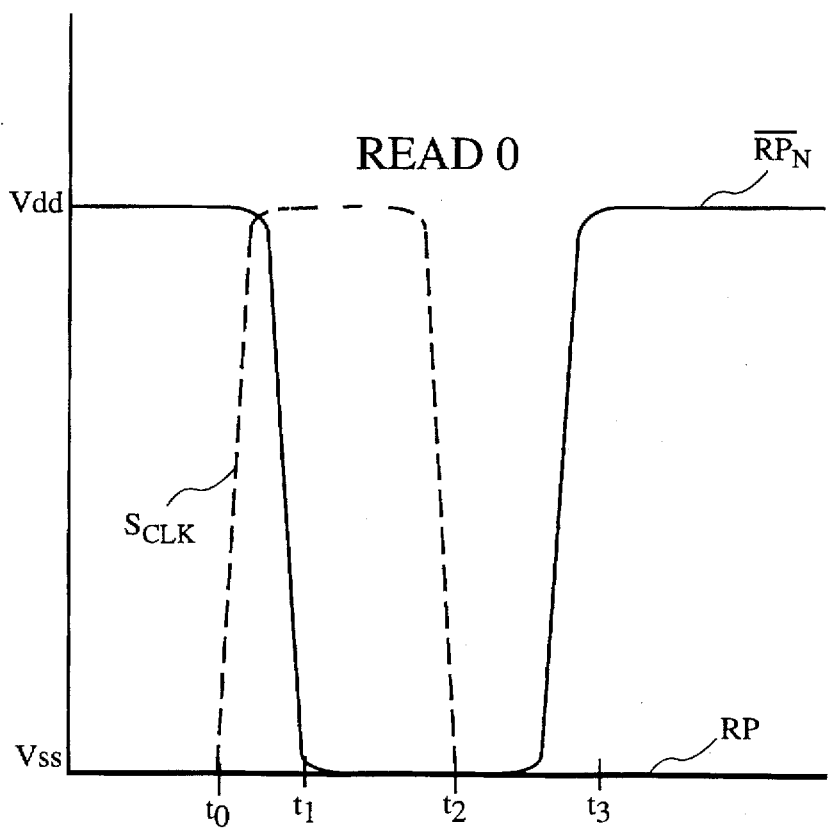
FIG. 2C is a graphical representation illustrating preferred output voltage signals /$RP_N$ and RP of a latch sense amplifier during a "read 0" cycle.

FIG. 2C is a graphical representation illustrating preferred output voltage signals /RP$_N$ and RP of the latch sense amplifier 202 during a "read 0" cycle. In this embodiment, latch sense amplifier 202 voltage amplifies a sensed signal from a selected RAM cell location. For illustration purposes, assume that logical "0" drives outputs /RP$_N$ and RP. Throughout the "read 0" cycle, signal RP remains at a constant voltage level of about Vss which may be about 0V.

Preferably, the latch sense amplifier 202 is enabled or disabled by a rising or a falling edge, respectively, of sense clock signal $S_{CLK}$ having a width represented by an interval of about time $t_2$- time $t_0$. In one embodiment, a "read 0" cycle is initiated by a rising edge of sense clock $S_{CLK}$ signal (as indicated by time=time $t_0$) which causes the latch sense amplifier 202 to drive output signal /RP$_N$ to about Vss (e.g., from about Vdd to about 0 volts) beginning at some time $t_1$ subsequent to rising edge time $t_0$ of sense clock $S_{CLK}$. At the end of the current sense clock pulse (i.e., a falling edge) at time=time $t_2$, latch sense amplifier 202 is disabled and signal /RP$_N$ returns to its original value at about time=time $t_3$.

FIG. 3 is a circuit diagram illustrating preferred electrical interconnections contained within the latch sense amplifier circuit 202 in accordance with one embodiment of the present invention. As shown, a sensed read signal 216 from a selected RAM cell location (not shown) is preferably coupled to a source of a p-channel passgate transistor 310 whose drain is coupled to a node 317. As shown, node 317 is also preferably coupled to a drain of a p-channel transistor 304, a source of an n-channel transistor 308 and an input of an inverter 312. The source of p-channel transistor 304 is connected to a voltage supply Vdd, and node 317 is electrically identical to a node 325.

A sensed read signal 218 from a selected RAM cell location (not shown) is preferably coupled to a source of a p-channel transistor 322 whose drain is coupled to a node 324. As shown, node 324 is preferably coupled to a drain of a p-channel transistor 302 and a source of a n-channel transistor 306. The source of p-channel transistor 302 is preferably connected to a voltage supply Vdd. In this embodiment a node 319 is electrically identical to a node 324 that defines an input of an inverter 314. A node 318 is coupled to a drain of an n-channel transistor 308 as well as a drain of an n-channel transistor 306. Node 318 is also connected to a source of an n-channel transistor 316 has a drain connected to Vss (i.e., ground).

In this embodiment, a node 320 defines an output of inverter 314 that provides read signal RP from the latch sense amplifier 202. A node 313 defines an output of inverter 312 as well as an input to an inverter 336 that outputs latch sense amplifier 202 read signal /RP$_N$ at a node 321. In this embodiment, sense clock $S_{CLK}$ signal is shown as an input to a node 370 for providing a clock signal to a gate of p-channel transistor 310, a gate of p-channel transistor 322, and a gate of n-channel transistor 316.

During a "read" cycle, a RAM cell location is selected and digital data stored in the selected RAM cell location drives inputs 216 and 218 of latch sense amplifier 202 to complementary states (i.e., RD and /RD). By way of example, if a selected RAM cell location has digital data stored such that node 216 is driven to a logical "1" state (i.e., RD=HIGH), then node 218 is driven to a logical "0" state (i.e., RD=LOW). However, the actual voltage difference between a logical "1" state and a logical "0" state may be as little as 50 mv which will necessarily require amplification. Amplification is preferably accomplished by a differential-type sense amplifier circuit defined by the combination of transistors 304, 308, 302, and 306 which are contained within the latch sense amplifier 202.

In operation, when sense clock signal $S_{CLK}$ is low, passgate transistor 310 is ON and node 216 drives the gate of pull up transistor 302 and the gate of pull down transistor 306 to a voltage level consistent with RD. Similarly, while sense clock signal $S_{CLK}$ is LOW, passgate transistor 322 is ON and node 218 drives the gate of pull-up transistor 304 and the gate of pull down transistor 308 to a voltage level consistent with /RD. When $S_{CLK}$ signal is LOW, transistor 316 is turned off to advantageously de-couple the drains of transistors 306 and 308 from ground. In order to drive p-channel transistor logic, complementary amplified read signal /RP is input into inverter 336 that outputs an inverted complementary amplified read signal /RP$_N$.

In this embodiment, when sense clock signal $S_{CLK}$ provides a rising edge at node 370, pass gate transistor 310 and pass gate transistor 322 are placed in an OFF state thereby isolating the selected RAM cell from the latch sense amplifier 202. Accordingly, a rising edge of sense clock $S_{CLK}$ causes transistor 316 to turn on thereby coupling drains of transistors 306 and 308 to ground.

By way of example, if the selected RAM cell location shifts signal RD to a logical "1" state, then signal /RD is at a logical "0". When sense clock signal $S_{CLK}$ is low, transistor 302 is in an OFF state, transistor 306 is in an OFF state, transistor 304 is in an OFF state, and transistor 308 is in an OFF state. When sense clock signal $S_{CLK}$ begins a transition to a high state, transistor 316 will turn on thereby coupling the drains of transistors 306 and 308 to ground. Node 317 will remain at about Vdd and node 324 will sink current through transistor 306 causing the input to inverter 314 to approach Vss. Complementary amplified read signal /RP at node 313 is further conditioned by inverter 336 resulting in read signal /RP$_N$ at node 321.

On the other hand, if the selected RAM cell location shifts signal RD to a logical "0" state, then signal /RD is at a logical "1". When sense clock signal $S_{CLK}$ is low, transistor 302 is in an OFF state, transistor 306 is in an OFF state, transistor 304 is in an OFF state, and transistor 308 is in an OFF state. When sense clock signal $S_{CLK}$ begins a transition to a high state, transistor 316 will turn ON thereby coupling the drains of transistors 306 and 308 to ground. Node 317 will then sink current through transistor 308 causing the input of inverter 312 to approach Vss, and node 324 will remain at about Vdd.

FIG. 4 is a circuit diagram illustrating preferred electrical interconnections contained within output data latch circuit 206 in accordance with one embodiment of the present invention. As shown, node 320 and node 321 of FIG. 3 represent inputs RP and /RP$_N$ to output data latching circuit 206. In this embodiment, node 320 is connected to a gate of an n-channel transistor 364, and node 321 is connected to a gate of a p-channel transistor 342.

A node 381 is connected to a drain of n-channel transistor 364 and a drain of a p-channel transistor 328 as well as defining an input to an inverter 330. N-channel transistor 364 has a source connected to ground while p-channel transistor 342 has a source connected to Vdd. A source of p-channel transistor 328 is connected to a drain of a p-channel transistor 326 whose source is connected to a voltage supply Vdd. In this embodiment, node 381 is electrically identical to both a node 380 and a DL input node 390. As shown, node 380 is connected to a drain of p-channel transistor 342 and a drain of an n-channel transistor 340 whose source is connected to a drain of an n-channel transistor 338. A drain of n-channel 338 is connected to ground.

Sense clock signal $S_{CLK}$ of FIG. 3 is shown input to output data latch 206 at node 370. Node 370 is connected to a gate of p-channel transistor 328, and an input to inverter 334 whose output is connected to a gate of n-channel transistor 340. A node 395 defines an output of inverter 330 at a node 329, and node 329 is connected to a gate of p-channel transistor 326 and n-channel transistor 338. In this embodiment, node 395 also defines an output node for output data latch 206 representing a signal DL$_O$ (DATA LINE $_O$), while node 390 defines an output node for output data latch 206 representing a signal DL (DATA LINE).

In this embodiment, output data latch 206 stores data when the falling edge of sense clock signal $S_{CLK}$ at node 370 turns ON feedback enable transistor 328. Simultaneously, inverter 334 phase inverts sense clock signal $S_{CLK}$ which turns ON feedback enable transistor 340. Because output data latch 206 is enabled, a data feedback loop circuit defined by feedback data low transistor 326 and feedback data high transistor 338 stores data input from node 329 as defined by inverter 330.

By way of example, when logical "0" data is read from the selected RAM cell location and is stored in data latch 206, sensed read signal RP remains LOW turning OFF transistor 364 while sensed read signal /RPN from latch sense amplifier 202 transitions from HIGH to LOW turning ON transistor 342 and transistor 326 while simultaneously turning OFF transistor 338. Conversely, when logical "1" data is read from the selected RAM cell location and stored in output data latch 206, read signal /RP$_N$ from latch sense amplifier 202 remains HIGH while RP transitions from LOW to HIGH thereby turning ON transistor 364 and 338 while simultaneously turning OFF transistor 326. In this embodiment, the rising edge of sense clock signal $S_{CLK}$ turns OFF both transistor 328 and transistor 340, thereby decoupling the output data latch circuit from input node 390.

FIG. 5 is a circuit diagram illustrating preferred electrical interconnections contained within output buffer circuit 204 in accordance with one embodiment of the present invention. As shown, node 390 and node 395 of FIG. 4 represent inputs DL and /DL$_O$, respectively, to output buffer circuit 204, while node 320 and node 321 represent inputs RP and /RP$_N$, respectively, to output buffer circuit 204. Node 390 defines an input to output buffer 204 and is electrically identical to nodes 380 and 381 of FIG. 4.

External output enable signal OE defines an input to inverter 332 and is connected to the gate of transistor 362. OE also drives the gate of transistor 360 whose source is connected to a voltage supply Vdd. An output of inverter 332 is connected to a gate of p-channel transistor 344 as well as to a gate of n-channel transistor 345 whose source is connected to ground. An external output signal Q is connected to a drain of n-channel transistor 352 and a drain of p-channel transistor 354.

In this embodiment, a signal path from input node 390 to output node Q is defined when OE goes HIGH and its phase inverted counterpart /OE goes LOW. When OE is HIGH, transistor 362 is turned ON thereby completing the signal path from input node 390 to transistor 354. At the same time, /OE is driven LOW by inverter 332 thereby turning ON transistor 344 and completing the signal path from node 390 to transistor 352. In operation, the completed signal path from node 390 to transistors 354 and 352 allows the stored logical data from the selected RAM cell location to propagate to output node Q ultimately driving output bus 216.

When OE is LOW output buffer 204 is disabled since both transistor 354 and transistor 352 are de-coupled from input node 390, resulting in output node Q being driven to what is commonly known in the art as "tristate mode."

As shown in this embodiment, node 381 is connected to a drain of n-channel transistor 362. A source of transistor 362 is connected with a drain of p-channel transistor 360, a drain of p-channel transistor 358, a drain of p-channel transistor 356 as well as a gate of p-channel transistor 354 whose source is connected to a voltage supply Vdd. In a like manner, p-channel transistor 344 has a source connected to node 380 and a drain connected to a drain of an n-channel transistor 345, a drain of an n-channel transistor 348, a drain of an n-channel transistor 350 as well as a gate of n-channel transistor 352 whose source is connected to ground.

Further, p-channel transistor 356 has a gate connected to node 395 (i.e., $DL_O$) and a source connected to voltage supply Vdd, while p-channel transistor 358 has a gate connected to node 321 (i.e., $/RP_N$) and a source connected to voltage supply Vdd. In a like manner, n-channel transistor 350 has a gate connected to node 395 (i.e., $DL_O$) and a source connected to ground, while n-channel transistor 348 has a gate connected to node 320 (i.e., RP) and a source connected to ground.

By way of example, when sense clock signal $S_{CLK}$ provides a rising edge, data stored in the selected RAM cell location as a logical "1" causes the latch sense amplifier 202 to drive RP from LOW to HIGH at node 320, while $/RP_N$ remains HIGH at node 321. The subsequent sense clock signal $S_{CLK}$ falling edge therefore causes RP to transition from HIGH to LOW thereby creating a read "1" pulse signal whose width is determined by the sense clock $S_{CLK}$ high pulse width. Advantageously, this read "1" pulse signal (i.e., RP=HIGH and /RPN=HIGH) turns ON transistor 364 in output latch 206 and transistor 348 in output buffer 204, while simultaneously disabling and storing logical "1" in output data storage latch 206. The falling of node 390 is then passed through transistor 362 thereby turning ON transistor 354.

In this embodiment, the read "1" pulse signal RP (and conversely, the read "0" pulse signal $/RP_N$) is a pulse signal whose width is determined by sense clock $S_{CLK}$ high pulse width. Since the falling edge of sense clock signal $S_{CLK}$ enables output data latch 206, any data stored during the falling edge of $S_{CLK}$ remains intact and available to drive output buffer 204 as input signals DL and $DL_O$. When read pulses $/RP_N$ and RP return to equilibrium subsequent to the falling edge of sense clock signal $S_{CLK}$ (i.e., no longer driving output buffer 204), DL (at node 390) and $DL_O$ (at node 395) provide the necessary input data to drive output buffer 204.

As an example, a logical "1" stored in the selected RAM cell location results in RP going high (i.e., turning on transistor 364) and DL driven LOW turning ON transistor 354 after turning OFF transistor 352. In this manner, output node Q is driven to a voltage level Vdd when output buffer 204 is enabled. In conventional output buffers, DL signals are slowly falling signals that lag (e.g., slow turn-off response) in turning OFF transistor 352. In this embodiment, the read "1" pulse signal RP=HIGH turns ON transistor 348 which advantageously assists in rapidly driving the gate of transistor 352 to Vss. By way of example, because transistor 348 is turned ON, crowbar current is further decreased between transistors 352 and 354. That is, without the assistance of transistor 348, transistor 354 would have to slowly provide additional current drive to drive output node Q and a lagging transistor 352. Accordingly, because transistor 352 is quickly turned off with the assistance of transistor 348, conduction through transistor 352 is substantially eliminated thereby producing rapid outputs through output buffer 204.

Conversely, when a logical "0" is stored in the selected RAM cell location, DL is driven HIGH which turns ON transistor 352 and turn OFF transistor 354, thereby driving output node Q to voltage level Vss. In conventional output buffers, DL is also a slowly rising signal which lags in turning OFF transistor 354. In order to speed up the turn off of transistor 354, the read "0" pulse signal $/RP_N$=LOW turns ON transistor 358. Accordingly, because transistor 358 is turned ON (i.e., turning off transistor 354), crowbar current between transistors 352 and 354 is substantially decreased or eliminated. As an advantage, the rapid turn off of transistor 354 assists in generating substantially faster outputs and lower power consumption in output buffer 204.

In this embodiment, transistor 356 and transistor 350 function as "keepers," to maintain the output signals at the desired states. By way of example, when a logical "1" is being read, transistor 350 ensures that transistor 352 is maintained in the off state during a read cycle. In a like manner, when a logical "0" is being read, transistor 356 ensures that transistor 354 is maintained in the off state. This keeper technique essentially prevents leakage through the transistors 352 and 354.

Although the foregoing invention has been described in some detail for purposes of clarity of understanding, it will be apparent that certain changes and modifications may be practiced within the scope of the appended claims. By way of example, although the high speed data output features of the various embodiments have been described with reference to random access memory devices, these high speed features are equally applicable to other electrical devices requiring fast amplification, output buffering and low power consumption.

In addition, it should be understood that the various circuits may be embodied in any form which may include, for example, any suitable semiconductor substrate, printed circuit board, or packaged integrated circuit. In addition, the various circuits may be implemented using software driven computer-implemented operations. By way of example, hardware description language (HDL) design and synthesis programs may be used to design silicon-level circuitry. By way of example, a VHDL® hardware description language available from IEEE of New York, N.Y. may be implemented to design silicon-level layouts. Accordingly, the present embodiments are to be considered as illustrative and not restrictive, and the invention is not to be limited to the details given herein, but may be modified within the scope and equivalents of the appended claims.

What is claimed is:

1. A latch sense amplifier output buffer for amplifying a data signal read from a memory device, comprising:

a sense amplifier core including an amplifier circuit, the amplifier circuit providing amplification on the data signal read from the memory device, the sense amplifier core configured to generate an amplified data signal;

an output data latching circuit being configured to substantially simultaneously store the amplified data signal and generate an output data signal; and an output buffer core that receives the amplified data signal from the sense amplifier core and the output data signal from the output data latching circuit, the output buffer core includes an output driver circuit that has a pull down transistor and a pull up transistor, and the amplified data signal is coupled to a first turn-off transistor and a second turn-off transistor that assist in providing a fast turnoff to one of the pull down and pull up transistors, thereby rapidly generating an output transition that outputs the output data signal at an output node that is coupled between the pull down and pull up transistors.

2. A latch sense amplifier output buffer as recited in claim 1, wherein the amplified data signal comprises a read pulse RP signal and a complementary read pulse /RPn signal.

3. A latch sense amplifier output buffer as recited in claim 2, wherein the read pulse RP signal assists in rapidly turning off the pull down transistor by turning on the first turn-off transistor that is coupled to ground.

4. A latch sense amplifier output buffer as recited in claim 2, wherein the complementary read pulse signal /RPn assists in rapidly turning off the pull up transistor by turning on the second turn-off transistor that is coupled to Vdd.

5. A latch sense amplifier output buffer as recited in claim 1, wherein the output data signal comprises a data latch signal DL and a complementary data latch signal $DL_0$.

6. A latch sense amplifier output buffer as recited in claim 5, wherein the data latch signal DL defines an input to the output driver circuit.

7. A latch sense amplifier output buffer as recited in claim 5, wherein the complementary data latch signal $DL_0$ assists in maintaining the pull down transistor in an off state and power consumption is reduced.

8. A latch sense amplifier output buffer as recited in claim 5, wherein the complementary data latch signal $DL_0$ assists in maintaining the pull up transistor in an off state.

9. A latch sense amplifier output buffer as recited in claim 5, wherein the output data latching circuit provides the data latch signal DL and the complementary data latch signal $DL_0$ stored in the output data latching circuit to the output buffer when each of the pull up and pull down transistors are in an off state.

10. A latch sense amplifier output buffer as recited in claim 1, further comprising an output enable circuit having at least one passgate transistor and at least one tristate triggering transistor that substantially simultaneously turns off the pull up transistor and the pull down transistor at a falling edge of a sense clock $S_{CLK}$ signal.

11. A latch sense amplifier output buffer as recited in claim 9, wherein the pull up transistor and the pull down transistor are turned off when an output enable signal is low after the falling edge of the sense clock $S_{CLK}$.

12. A method for amplifying a data signal read from a memory device, comprising:

generating an amplified read signal in a latch sense amplifier;

storing the amplified read signal in a data storage latch and concurrently passing the amplified read signal to an output buffer circuit, the data storage latch is configured to generate an output data latch signal to an output buffer core;

enabling the output buffer core upon receiving the output data latch signal from the data storage latch;

propagating the output data latch signal to each of a pull up transistor and a pull down transistor that are part of the output buffer while the amplified read signal assists in rapidly turning off either the pull up transistor or the pull down transistor; and outputting the amplified read signal from one of the pull up and the pull down transistors of the output buffer.

13. A method for amplifying a data signal read from a memory device as recited in claim 12, wherein the amplified read signal comprises a first amplified read signal RP for rapidly turning off the pull down transistor when the pull up transistor is on.

14. A method for amplifying a data signal read from a memory device as recited in claim 12, wherein the amplified read signal comprises a second amplified read signal /RPn for rapidly turning off the pull up transistor when the pull down transistor is on.

15. A method for amplifying a data signal read from a memory device as recited in claim 12, wherein the data latch signal comprises a first data latch signal DL for maintaining the pull down transistor off when the pull up transistor is on.

16. A method for amplifying a data signal read from a memory device as recited in claim 12, wherein the data latch signal comprises a second data latch signal $DL_0$ for maintaining the pull up transistor off when the pull down transistor is on.

17. A method for amplifying a data signal read from a memory device as recited in claim 12, wherein the step of enabling the output buffer core comprises turning on at least one pass gate transistor.

18. A method for amplifying a data signal read from a memory device as recited in claim 17, wherein when the at least one pass gate transistor is on, an input to the output buffer core is connected to each of the pull up and the pull down transistors.

19. A method for amplifying a data signal read from a memory device as recited in claim 18, wherein when the input is connected to each of the pull up and pull down transistors, one of each of the pull up and pull down transistors is on.

20. A method for amplifying a data signal read from a memory device as recited in claim 18, wherein when the input is connected to each of the pull up and pull down transistors, one of each of the pull up and pull down transistors is off.

21. A method for outputting an amplified data signal read from a memory device, comprising:

storing the amplified data signal in a data storage latch and simultaneously outputting the amplified data signal to an output buffer circuit that uses a pair of turn-off assisting transistors, the data storage latch is configured to propagate an output data latch signal to a pair of output driving transistors of the output buffer;

enabling the output buffer circuit when the output data latch signal from the data storage latch is received by the output buffer circuit;

passing the output data latch signal to the pair of output driving transistors; and outputting the amplified data signal from one of the pair of output driving transistors while one of the pair of turn-off assisting transistors is placed in an on state.

22. A method for outputting an amplified data signal read from a memory device, comprising:

receiving the amplified data signal from the memory device;

storing the amplified data signal in a data storage circuit;

supplying the amplified data signal to an output buffer circuit at about the same time of the storing of the amplified data signal in the data storage circuit;

passing a data transfer signal from the data storage circuit to the output buffer circuit; and activating the output buffer circuit to output an output signal when the data transfer signal from the data storage latch is received at the output buffer circuit the output buffer circuit uses a pair of turn-off transistors that receive the supplied amplified data signal and thereby assist in rapidly producing the output signal.

23. A circuit for amplifying a data signal that is read from a memory device, comprising:

a sense amplifier circuit that amplifies the data signal read from the memory device and outputs an amplified data signal PR and a complementary amplified data signal /PRn;

an output data latching circuit is configured to receive and store the amplified data signal PR and the complementary amplified data signal /PRn, and the output data latching circuit generates an output data signal DL and a complementary output data signal $DL_O$; and an output buffer circuit is also configured to receive the amplified data signal PR and the complementary amplified data signal /PRn from the sense amplifier, and receive the output data signal DL and the complementary output data signal $DL_O$ from the output data latching circuit, the output buffer circuit includes an output driver circuit that has a pull down transistor and a pull up transistor, and the amplified data signal PR is coupled to a first turn-off transistor and the complementary amplified data signal /PRn is coupled to a second turn-off transistor, such that the first turn-off transistor assist in rapidly turning off the pull down transistor when outputting a digital ONE and the second turn-off transistor assists in rapidly turning off the pull up transistor when outputting a digital ZERO.

24. A circuit as recited in claim 23, wherein a rising edge of a sense clock $S_{CLK}$ activates the output buffer circuit.

25. A circuit as recited in claim 23, wherein a rising edge of a sense clock $S_{CLK}$ disables the output data latching circuit to enable it to store the amplified data signal PR and the complementary amplified data signal /PRn.

26. A circuit as recited in claim 23, wherein a rising edge of a sense clock $S_{CLK}$ enables the sense amplifier circuit.

27. A circuit as recited in claim 23, wherein a falling edge of a sense clock $S_{CLK}$ disables the sense amplifier circuit and enables the output data latching circuit.

28. A circuit as recited in claim 23, wherein the sense amplifier circuit, the output data latching circuit, and the output buffer circuit are fabricated onto one or more semiconductor chips.

\* \* \* \* \*